United States Patent
Chen

(10) Patent No.: US 9,761,836 B2
(45) Date of Patent: Sep. 12, 2017

(54) FLUORINE-CONTAINING PLASMA POLYMERIZED HMDSO FOR OLED THIN FILM ENCAPSULATION

(71) Applicant: Applied Materials, Inc., Santa Clara, CA (US)

(72) Inventor: Jrjyan Jerry Chen, Campbell, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/094,582

(22) Filed: Apr. 8, 2016

(65) Prior Publication Data

US 2016/0226025 A1    Aug. 4, 2016

Related U.S. Application Data

(63) Continuation of application No. 14/174,248, filed on Feb. 6, 2014, now Pat. No. 9,331,311.

(Continued)

(51) Int. Cl.
*H01L 51/52*    (2006.01)
*H01L 51/56*    (2006.01)
(Continued)

(52) U.S. Cl.
CPC ........ *H01L 51/5256* (2013.01); *C23C 16/401* (2013.01); *H01L 51/0094* (2013.01);
(Continued)

(58) Field of Classification Search
CPC .................................................. H01L 51/5253
See application file for complete search history.

(56) References Cited

U.S. PATENT DOCUMENTS 6,043,167 A * 3/2000 Lee ......................... C23C 16/30
                                                              257/E21.264
6,068,884 A * 5/2000 Rose ........................ C09D 4/00
                                                              257/E21.26

(Continued)

FOREIGN PATENT DOCUMENTS

CN        10142300 A       4/2009
KR     2001-0101231        11/2001
(Continued)

OTHER PUBLICATIONS

Zheludkevich, et al.; Elsevier: Surface & Coatings Technology: Barrier Properties of Polyurethane Coil Coatings Treated by Microwave Plasma Polymerization; dated Oct. 2004; 10 total pages.

(Continued)

*Primary Examiner* — Cuong Q Nguyen
*Assistant Examiner* — Nishath Yasmeen
(74) *Attorney, Agent, or Firm* — Patterson + Sheridan LLP

(57) ABSTRACT

Methods for forming an OLED device are described. An encapsulation structure having organic buffer layer sandwiched between barrier layers is deposited over an OLED structure. The buffer layer is formed with a fluorine-containing plasma. The second barrier layer is then deposited over the buffer layer. Additionally, to ensure good adhesion, a buffer adhesion layer is formed between the buffer layer and the first barrier layer. Finally, to ensure good transmittance, a stress reduction layer is deposited between the buffer layer and the second barrier layer.

20 Claims, 4 Drawing Sheets

Related U.S. Application Data

(60) Provisional application No. 61/893,384, filed on Oct. 21, 2013, provisional application No. 61/772,509, filed on Mar. 4, 2013.

(51) Int. Cl.
*C23C 16/40* (2006.01)
*H01L 51/00* (2006.01)

(52) U.S. Cl.
CPC .......... *H01L 51/5253* (2013.01); *H01L 51/56* (2013.01); *H01L 51/0034* (2013.01)

(56) References Cited

U.S. PATENT DOCUMENTS

| | | | |
|---|---|---|---|
| 6,150,187 | A | 11/2000 | Zyung et al. |
| 6,465,953 | B1 | 10/2002 | Duggal |
| 7,074,501 | B2 | 7/2006 | Czeremuszkin et al. |
| 2004/0152390 | A1 | 8/2004 | Chung et al. |
| 2007/0290201 | A1* | 12/2007 | Hoffmann ........... H01L 51/5253 257/40 |
| 2011/0097533 | A1* | 4/2011 | Li .................. C23C 16/029 428/68 |
| 2011/0273077 | A1* | 11/2011 | Chen .................. H01L 51/5246 313/483 |
| 2011/0291077 | A1 | 12/2011 | Fong et al. |
| 2012/0199872 | A1 | 8/2012 | Chen et al. |
| 2012/0208306 | A1 | 8/2012 | Haas et al. |
| 2014/0024180 | A1 | 1/2014 | Choi et al. |
| 2014/0065739 | A1 | 3/2014 | Chen et al. |

FOREIGN PATENT DOCUMENTS

| | | |
|---|---|---|
| WO | 2012/173692 A1 | 12/2012 |
| WO | 2012/174550 A2 | 12/2012 |

OTHER PUBLICATIONS

PCT Notification of Transmittal of the International Search Report and the Written Opinion of the International Searching Authority for International Application No. PCT/US2014/015060 dated May 28, 2014; 13 total pages.

Chinese Office Action (with attached English translation of the Search Report) for Application No. 201480011308.4; dated Jul. 27, 2016; 11 total pages.

International Preliminary Report on Patentability dated Sep. 17, 2015 for Application No. PCT/US2014/015060.

* cited by examiner

FLUORINE-CONTAINING PLASMA POLYMERIZED HMDSO FOR OLED THIN FILM ENCAPSULATION

CROSS-REFERENCE TO RELATED APPLICATIONS

This application is a continuation application of co-pending U.S. patent application Ser. No. 14/174,248, filed on Feb. 6, 2014, which claims the benefit of U.S. Provisional Patent Application Ser. Nos. 61/772,509 (APPM 20433L), filed Mar. 4, 2013, and 61/893,384 (APPM 20433L02), filed Oct. 21, 2013, which are herein incorporated by reference.

BACKGROUND

Field

Embodiments of the invention generally relate to a method and apparatus for encapsulating an organic light emitting diode (OLED).

Description of the Related Art

An OLED is used in the manufacture of television screens, computer monitors, mobile phones, other hand-held devices, etc. for displaying information. OLED displays have gained significant interest recently in display applications due to their faster response time, larger viewing angles, higher contrast, lighter weight, low power and amenability to flexible substrates such as compared to liquid crystal displays (LCD).

OLED structures may have a limited lifetime, characterized by a decrease in electroluminescence efficiency and an increase in drive voltage. A main reason for the degradation of OLED structures is the formation of non-emissive dark spots due to moisture or oxygen ingress. For this reason, OLED structures are typically encapsulated by a buffer layer sandwiched between barrier layers. The buffer layer is utilized to fill any voids or defects in the first barrier layer such that the second barrier layer has a substantially uniform surface for deposition. It has been observed that the current encapsulation layers may have difficulties in preventing failures from poor particle coverage.

Therefore, an improved method and apparatus for encapsulating an OLED structure is needed.

SUMMARY

Methods for forming an OLED device are described. An encapsulation structure having a buffer layer sandwiched between barrier layers is deposited over an OLED structure. The buffer layer is formed with a fluorine-containing plasma. The second barrier layer is then deposited over the buffer layer. Additionally, to ensure good adhesion, a buffer adhesion layer is formed between the buffer layer and the first barrier layer. Finally, to ensure good transmittance, a stress reduction layer is deposited between the buffer layer and the second barrier layer.

In one embodiment, a method for forming an encapsulating structure on an organic light emitting diode (OLED) device comprises depositing a first barrier layer on a region of a substrate having an OLED structure disposed thereon; depositing a buffer adhesion layer on the first barrier layer; depositing buffer layer with a fluorine-containing plasma on the buffer adhesion layer; depositing a stress reduction layer on the buffer layer; and depositing a second barrier layer on the stress reduction layer.

In another embodiment, an OLED device comprises a first barrier layer disposed on a region of a substrate having an OLED structure disposed thereon; a buffer adhesion layer disposed on the first barrier layer; a fluorinated buffer layer disposed on the buffer adhesion layer; a stress reduction layer deposited on the fluorinated buffer layer; and a second barrier layer disposed on the stress reduction layer.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Methods for forming an OLED device are described. An encapsulation structure having organic buffer layer sandwiched between barrier layers is deposited over an OLED structure. The buffer layer is formed with a fluorine-containing plasma. The second barrier layer is then deposited over the buffer layer. Additionally, to ensure good adhesion, a buffer adhesion layer is formed between the buffer layer and the first barrier layer. Finally, to ensure good transmittance, a stress reduction layer is deposited between the buffer layer and the second barrier layer.

Figure 1A:
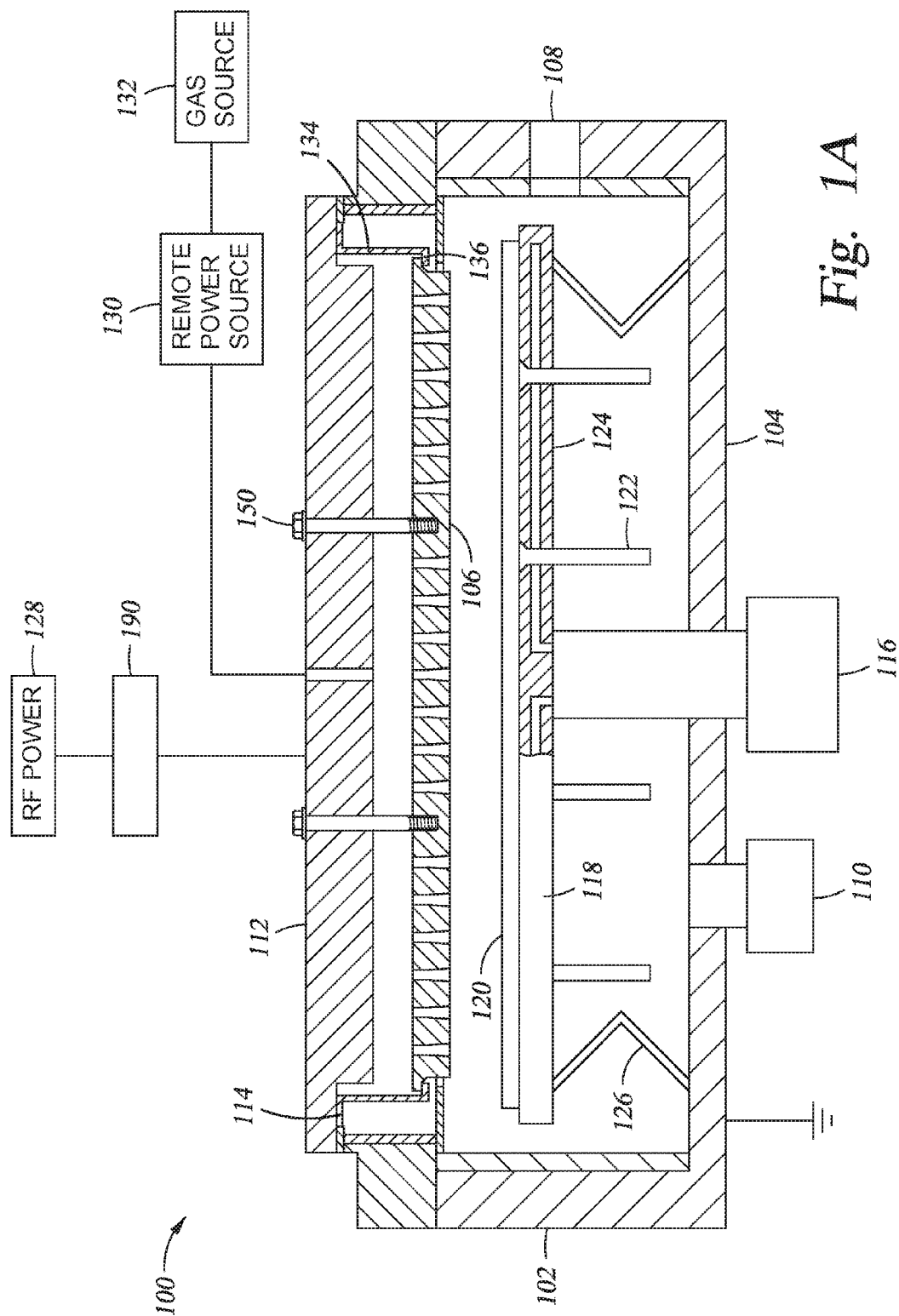
FIG. 1A is a schematic, cross-sectional view of a PECVD apparatus chamber that may be used to perform the methods described herein.

FIG. 1A is a schematic, cross sectional view of a plasma enhanced chemical vapor deposition (PECVD) apparatus that may be used to perform the operations described herein. The apparatus includes a chamber 100 in which one or more films may be deposited onto a substrate 120. The chamber 100 generally includes walls 102, a bottom 104 and a showerhead 106 which define a process volume. A substrate support 118 is disposed within the process volume. The process volume is accessed through a slit valve opening 108 such that the substrate 120 may be transferred in and out of the chamber 100. The substrate support 118 is coupled to an actuator 116 to raise and lower the substrate support 118. Lift pins 122 are moveably disposed through the substrate support 118 to move the substrate 120 to and from the substrate receiving surface. The substrate support 118 also includes heating and/or cooling elements 124 to maintain the substrate support 118 at a desired temperature. The substrate support 118 also includes RF return straps 126 to provide an RF return path at the periphery of the substrate support 118.

The showerhead 106 is coupled to a backing plate 112 by a fastening mechanism 150. The showerhead 106 is coupled to the backing plate 112 by one or more fastening mechanisms 150 to help prevent sag and/or control the straightness/curvature of the showerhead 106.

A gas source 132 is coupled to the backing plate 112 to provide gas through gas passages in the showerhead 106 to a processing area between the showerhead 106 and the substrate 120. A vacuum pump 110 is coupled to the chamber 100 to maintain the process volume at a desired pressure. An RF source 128 is coupled through a match network 190 to the backing plate 112 and/or to the showerhead 106 to provide an RF current to the showerhead 106. The RF current creates an electric field between the showerhead 106 and the substrate support 118 so that a plasma may be generated from the gases between the showerhead 106 and the substrate support 118.

A remote plasma source 130, such as an inductively coupled remote plasma source 130, is coupled between the gas source 132 and the backing plate 112. Between processing substrates, a cleaning gas may be provided to the remote plasma source 130 so that a remote plasma is generated. The radicals from the remote plasma may be provided to chamber 100 to clean chamber 100 components. The cleaning gas may be further excited by the RF source 128 provided to the showerhead 106.

The showerhead 106 is additionally coupled to the backing plate 112 by showerhead suspension 134. In one embodiment, the showerhead suspension 134 is a flexible metal skirt. The showerhead suspension 134 may have a lip 136 upon which the showerhead 106 may rest. The backing plate 112 may rest on an upper surface of a ledge 114 coupled with the chamber walls 102 to seal the chamber 100.

Figure 1B:
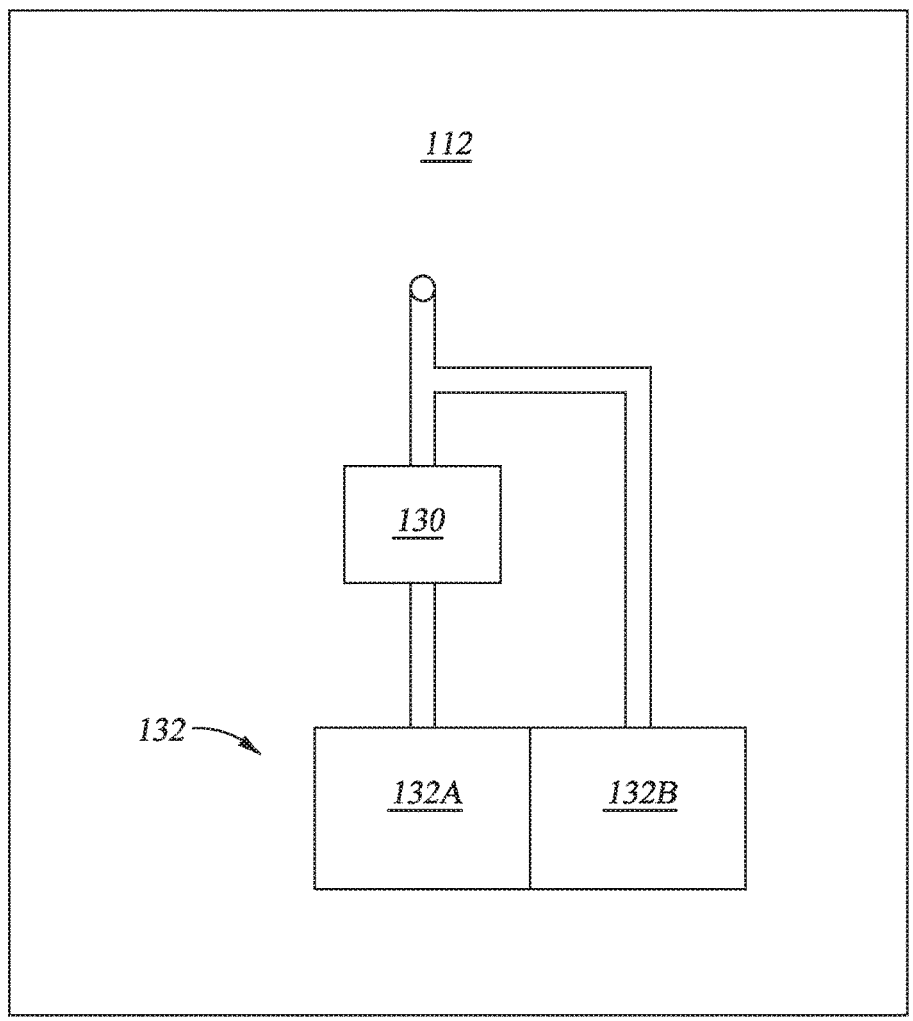
FIG. 1B is a schematic top view of the PECVD apparatus of FIG. 1A.

As shown in FIG. 1B, the gas source 132 comprises a first portion 132A and a second portion 132B. The first portion 132A feeds gas directly to the remote plasma source 130 and then to the chamber 100 through the backing plate 112. Second portion 132B delivers gas to the chamber 100 through the backing plate 112 by bypassing the remote plasma source 130.

Figure 2:
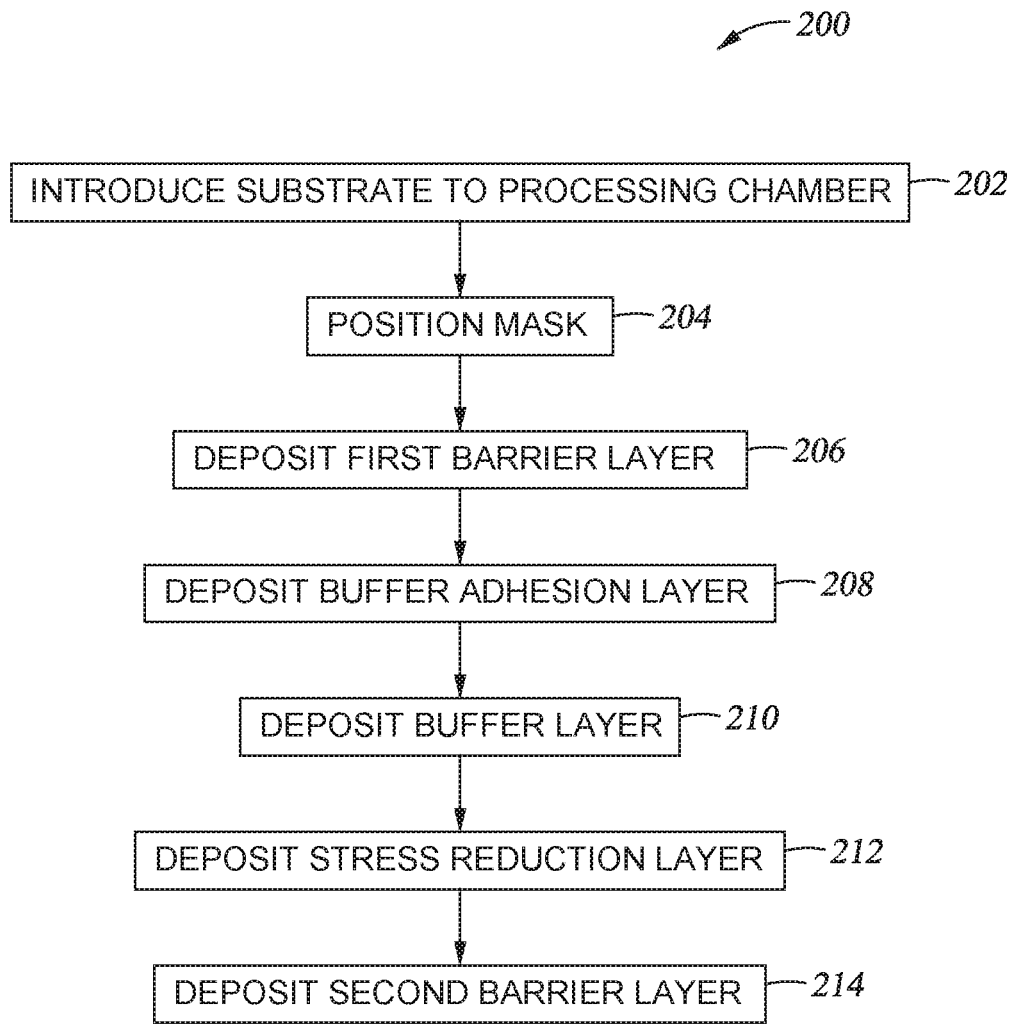
FIG. 2 is a flow diagram of a method for forming an OLED device in accordance with one embodiment of the present invention.
Figure 3A:
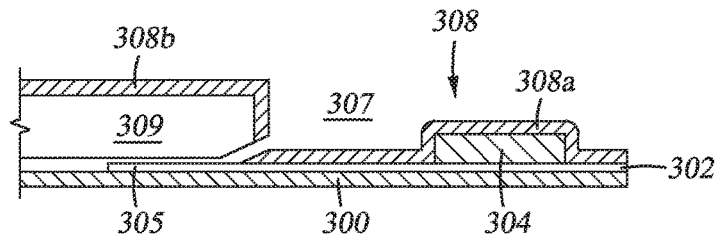
FIGS. 3A-3E illustrate schematic cross-sectional views of the OLED device during different stages of the method of FIG. 2.

FIG. 2 is a flow diagram of a method 200 for forming an encapsulating structure over an OLED device according to various embodiments of the invention. FIGS. 3A-3E illustrate schematic cross-sectional views of an OLED device during different stages of the method 200 of FIG. 2. The method 200 starts at process 202 by introducing a substrate 300 having a preformed OLED structure 304 disposed thereon into a processing chamber such as chamber 100. The substrate 300 may have a contact layer 302 disposed thereon, with the OLED structure 304 disposed on the contact layer 302, as shown in FIG. 3A.

At process 204, a mask 309 is aligned over the substrate 300 such that the OLED structure 304 is exposed through an opening 307 unprotected by the mask 309, as shown in FIG. 3A. The mask 309 is positioned such that a portion 305 of the contact layer 302 adjacent the OLED structure 304 is covered by the mask 309 so that any subsequently deposited material does not deposit on the portion 305. The portion 305 of the contact layer 302 is the electrical contact for the OLED device, thus no material may be deposited thereon. The mask 309 may be made from a metal material, such as INVAR®.

At process 206, a first barrier layer 308 is deposited on the substrate 300, as shown in FIG. 3A. The first barrier layer 308 has a first portion 308a and a second portion 308b and a thickness of between about 5000 Angstroms and about 10000 Angstroms. The first portion 308a of the first barrier layer 308 is deposited through the opening 307 onto a region of the substrate 300 exposed by the mask 309, which includes the OLED structure 304 and a portion of the contact layer 302. The second portion 308b of the first barrier layer 308 is deposited on the mask 309 covering a second region of the substrate 300, which includes the portion 305 of the contact layer 302. The first barrier layer 308 is a dielectric layer, such as silicon nitride (SiN), silicon oxynitride (SiON), silicon dioxide ($SiO_2$), aluminum oxide ($Al_2O_3$), aluminum nitride (AlN), or other suitable dielectric layers. In one embodiment, the first barrier layer 308 comprises silicon nitride. The first barrier layer 308 may be deposited by a suitable deposition technique, such as chemical vapor deposition (CVD), PECVD, physical vapor deposition (PVD), spin-coating, or other suitable technique. The first barrier layer 308 may be deposited by introducing a silicon containing precursor, such as silane, together with one or more nitrogen containing precursors, such as $N_2$ and $NH_3$, together with hydrogen.

Figure 3B:
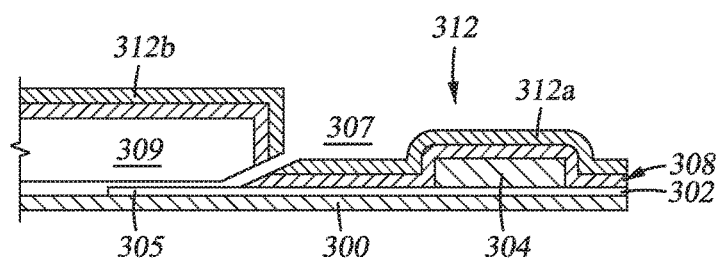

At process 208, after the first barrier layer 308 is formed on the substrate 300, a buffer adhesion layer 312 is then formed on the first barrier layer 308 on the substrate 300, as shown in FIG. 3B. A first portion 312a of the buffer adhesion layer 312 is deposited on the substrate 300 through the opening 307 of the mask 309 on the region of the substrate 300 exposed by the mask 309, covering the first portion 308a of first the inorganic layer 308. A second portion 312b of the buffer adhesion layer 312 is deposited on the second portion 308b of the first barrier layer 308 disposed on the mask 309, which covers the portion 305 of the contact layer 302. The buffer adhesion layer 312 is deposited on the first barrier layer 308 within the same chamber that the first barrier layer 308 is formed. The buffer adhesion layer may 312 comprise a dielectric material such as silicon oxynitride.

Figure 3C:
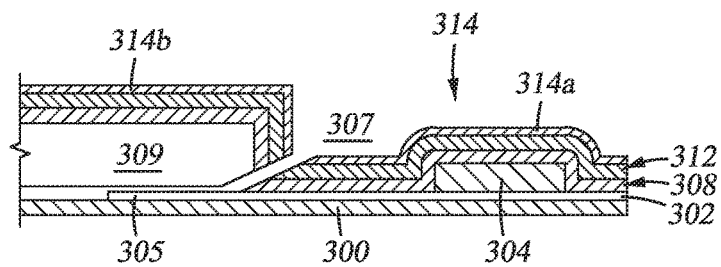

After depositing the buffer adhesion layer 312, the buffer layer 314 is deposited in process 210 as shown in FIG. 3C. The buffer layer 314 may be fluorinated plasma-polymerized hexamethyldisiloxane (pp-HMDSO:F) deposited in a PECVD chamber. The buffer layer 314 has a thickness of between about 2 pm to about 5 μm. Deposition of the pp-HMDSO:F layer is achieved by flowing one or more fluorine-containing gases and HMDSO gas along with either $O_2$ or $N_2O$ gas. The fluorine-containing gas may be nitrogen fluoride ($NF_3$), silicon fluoride ($SiF_4$), fluorine gas ($F_2$), carbon tetrafluoride ($CF_4$), or any combination thereof. Fluorine doped plasma polymerized HMDSO layer has superior particle coverage performance and surface planarization effect. The resulting buffer layer 314 has a fluorine content of less than 10 atomic percent.

During the deposition of the pp-HMDSO:F, the ratio of the flow rates of the fluorine-containing gas and the HMDSO gas may be between about 0.25 and about 1.5. If there is too much fluorine, the carbon in the HMDSO may be taken out. In one embodiment, the PECVD of the pp-HMDSO:F is performed under the following conditions. The $SiF_4$ has a flow rate of 125 standard cubic centimeters per minute (sccm) and HMDSO has a flow rate of 300 sccm. In other words, the ratio of SiF4 to HMDSO is between about 0.40 to about 0.45. The plasma is generated at 700 W and the chamber pressure is about 1800 mtorr. The PECVD is deposited at about 80 degrees Celsius and the distance between the substrate 300 and the showerhead 106 is about 650 mil.

When depositing the buffer layer 314, the HMDSO is initially a liquid precursor that is vaporized before delivery to the chamber. As such, the liquid precursor, even though vaporized, may spray into the chamber which leads to undesired particles forming at the interface with the buffer adhesion layer 312. The particles can lead to delamination of the buffer layer 314 and device failure. To prevent formation of the undesired particles, spraying of the HMDSO needs to be reduced and/or eliminated. Thus, the precursor flow for the buffer layer 314 is ramped up rather than simply turned on at the final-desired flow rate. The ramp up occurs in a two step process whereby the first step includes introducing the silicon-carbon containing precursor, such as HMDSO at a flow rate per substrate surface area of between about 0.000375 sccm/mm$^2$ to about 0.000675 sccm/mm$^2$ while also introducing an inert gas, such as helium, at a flow rate per substrate surface area of between about 0.000375 sccm/mm$^2$ to about 0.000675 sccm/mm$^2$. An oxygen containing precursor, such as N$_2$O, is then introduced at a flow rate per substrate surface area of between about 0.003125 sccm/mm$^2$ and about 0.003375 sccm/mm$^2$ while the fluorine precursor is introduced at a flow rate per substrate surface area of between about 0.0003 sccm/mm$^2$ and about 0.0004 sccm/mm$^2$. The second step lasts as long as the first step. During the second step, the precursors continue to flow, but the silicon-carbon containing precursor is increased to between about 0.000875 sccm/mm$^2$ to about 0.001125 sccm/mm$^2$, the inert gas is increased to between about 0.0007 sccm/mm$^2$ and about 0.0008 sccm/mm$^2$ and the fluorine precursor is increased to between about 0.000425 sccm/mm$^2$ and about 0.00055 sccm/mm$^2$. The oxygen containing precursor remains at the same flow rate.

Following the ramp up, the buffer layer deposition continues by flowing the silicon-carbon precursor at a flow rate per substrate surface area of between about 0.001375 sccm/mm$^2$ and about 0.0016 sccm/mm$^2$, flowing the inert gas at between about 0.00095 sccm/mm$^2$ and about 0.0011 sccm/mm$^2$, and flowing the fluorine precursor at a flow rate per substrate surface area of between about 0.0007 sccm/mm$^2$ and about 0.000825 sccm/mm$^2$. The oxygen containing precursor flow rate per substrate surface area changes throughout the deposition by incrementally decreasing to between about 0.001125 sccm/mm$^2$ and about 0.001275 sccm/mm$^2$ in 0.0005 sccm/mm$^2$ increments every 10-20 seconds. The oxygen containing precursor holds steady for about 70-90 seconds before increasing. The oxygen precursor flow rate per substrate surface area increases incrementally to between about 0.003125 sccm/mm$^2$ to about 0.003375 sccm/mm$^2$ in 0.0005 sccm/mm$^2$ increments every 60 to 70 seconds. Because of the ramp up, the particle generation at the interface between the buffer layer and buffer adhesion layer is reduced or eliminated.

In addition to the problem of particle generation, the silicon-carbon precursor and the fluorine precursor will react, so care must be taken to ensure the precursors do not react prematurely. To avoid premature reaction between the precursors, the fluorine containing precursor and the silicon-carbon precursor may be delivered separately. Using the processing chamber of FIG. 1, the fluorine containing precursor may be delivered from portion 132B and bypass the remote plasma source 130 while the remaining precursor gases may be delivered from portion 132A and pass through the remote plasma source 130.

Because the silicon-carbon precursor is a liquid precursor that is vaporized, the showerhead 106 may still be 'wet' (i.e., remnants of the liquid precursor may remain on the showerhead 106 or within the gas passages). The showerhead 106 must then be dried. The drying occurs by ramping down the precursors while simultaneously introducing an inert gas such as N$_2$ at a flow rate per substrate surface area of between about 0.0095 sccm/mm$^2$ and about 0.01125 sccm/mm$^2$. The inert gas continues to flow after the other precursors have stopped flowing. Simultaneous with the inert gas flow, and after the precursor flow has stopped, the substrate may be moved away from the showerhead 106.

Figure 3D:
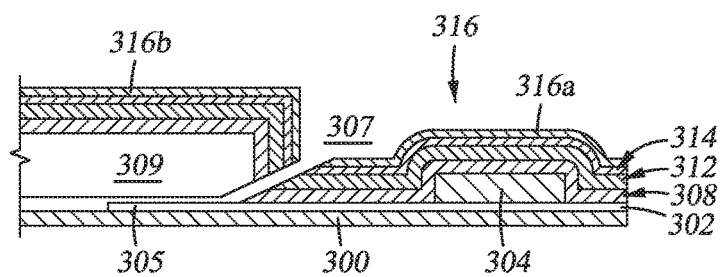

If the second barrier layer 318 were deposited over the buffer layer 314, the resulting encapsulation structure would have poor optical transmittance such as around 70 percent. The second barrier layer 318 may have a thickness of between about 5000 Angstroms and about 10000 Angstroms. The poor transmission is believed to be caused by the second barrier layer 318 having compressive stress. To ensure good optical transmittance (i.e., transmittance of greater than 90 percent), a stress reduction layer 316 may be deposited in process 212 as shown in FIG. 3D. The stress reduction layer 316 may comprise a dielectric material such as silicon oxynitride and be formed by introducing a silicon containing precursor, a nitrogen containing precursor, and oxygen containing precursor and hydrogen. The stress reduction layer 316 will have a slight tensile stress to counteract the compressive stress of the second barrier layer 318. The stress reduction layer 316 includes a first portion 316a deposited over the first portion 314a of the buffer layer 314 and a second portion 316b deposited over the second portion 314b of the buffer layer 314.

Figure 3E:
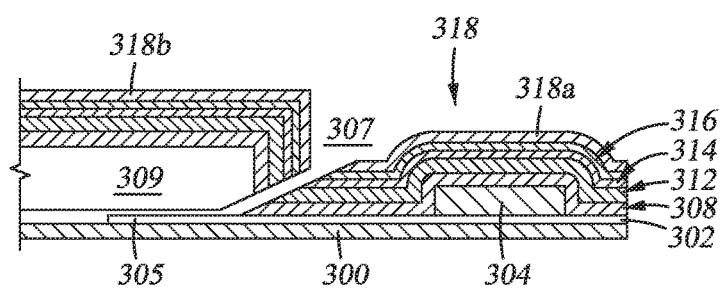

At process 214, a second barrier layer 318 is formed over the substrate 300, covering the stress reduction layer 316, as shown in FIG. 3E. The second barrier layer 318 includes a first portion 318a deposited over the first portion 316a of the stress reduction layer 316 and a second portion 318b deposited over the second portion 316b of the stress reduction layer 316.

The second barrier layer 318 may be a dielectric layer similar to the first barrier layer 308. The second barrier layer 318 is a dielectric layer such as SiN, SiON, SiO$_2$, or other suitable dielectric layers. In one embodiment, the second barrier layer 318 comprises silicon nitride. The second barrier layer 318 may be deposited by a suitable deposition technique, such as CVD, PVD, spin-coating, or other suitable technique.

The deposition of the first barrier layer, the buffer adhesion layer, the buffer layer, the stress reduction layer and the second barrier layer as described herein may be performed in a single deposition chamber, such as PECVD chamber 100. Purging of the process chamber may be performed between cycles to minimize the risk of contamination. The single chamber process may be advantageous in reducing cycle times as well as reducing the number of chambers (and equipment costs) of using a multiple chamber process.

In summary, an OLED device is formed with a buffer layer sandwiched between two barrier layers. The buffer layer is formed over a first barrier layer with a fluorine-containing plasma. A second barrier layer is formed over the organic layer.

While the foregoing is directed to embodiments of the present disclosure, other and further embodiments of the disclosure may be devised without departing from the basic scope thereof, and the scope thereof is determined by the claims that follow.

The invention claimed is:

1. A method for forming an encapsulating structure on a display device, comprising:
   depositing a first barrier layer on a region of a substrate having a display device disposed thereon;
   depositing a buffer adhesion layer on and in direct physical contact with the first barrier layer;
   depositing a buffer layer with a fluorine-containing plasma on and in direct physical contact with the buffer adhesion layer, wherein a flow rate of one or more precursor gases for depositing the buffer layer is increased during the depositing the buffer layer;

depositing a stress reduction layer on and in direct physical contact with the buffer layer; and depositing a second barrier layer on and in direct physical contact with the stress reduction layer.

2. The method of claim 1, wherein the buffer layer comprises fluorinated plasma-polymerized hexamethyldisiloxane (pp-HMDSO:F).

3. The method of claim 2, wherein the one or more precursor gases comprise one or more fluorine-containing gases and HMDSO gas.

4. The method of claim 3, wherein the fluorine-containing gas is selected from the group consisting of NF3, SiF4, F2, CF4, and combinations thereof.

5. The method of claim 4, wherein a ratio of flow rates of the fluorine-containing gas and HMDSO gas is between 0.25 and 1.5.

6. The method of claim 1, wherein the first and second barrier layers, the buffer adhesion layer, the stress reduction layer and the buffer layer are deposited in a single process chamber.

7. The method of claim 6, wherein the single process chamber is a plasma enhanced chemical vapor deposition (PECVD) chamber.

8. The method of claim 7, wherein the buffer adhesion layer comprises silicon oxynitride.

9. The method of claim 8, wherein the stress reduction layer comprises silicon oxynitride.

10. The method of claim 9, wherein the first and second barrier layers each comprises silicon nitride.

11. The method of claim 1, wherein a same mask is used for depositing the first barrier layer, buffer layer and second barrier layer.

12. The method of claim 1, wherein the first barrier layer and the buffer adhesion layer are made of different materials, and the stress reduction layer and the second barrier layer are made of different materials.

13. The method of claim 12, wherein the first and second barrier layers each comprises silicon nitride, the buffer adhesion layer and the stress reduction layer each comprises silicon oxynitride, and the buffer layer comprises fluorinated plasma-polymerized hexamethyldisiloxane (pp-HMDSO:F).

14. The method of claim 1, wherein the first and second barrier layers each comprises silicon nitride, the buffer adhesion layer and the stress reduction layer each comprises silicon oxynitride, and the buffer layer comprises fluorinated plasma-polymerized hexamethyldisiloxane (pp-HMDSO:F).

15. The method of claim 1, wherein the display device is an organic light emitting diode (OLED) device.

16. A method for forming an encapsulating structure on a display device, comprising:

depositing a first barrier layer on a region of a substrate having a display device disposed thereon;

depositing a buffer adhesion layer on and in direct physical contact with the first barrier layer;

depositing a buffer layer with a fluorine-containing plasma on and in direct physical contact with the buffer adhesion layer, wherein a flow rate of one or more precursor gases for depositing the buffer layer is increased during the depositing the buffer layer;

depositing a stress reduction layer on and in direct physical contact with the buffer layer; and depositing a second barrier layer on and in direct physical contact with the stress reduction layer, wherein the first and second barrier layers, the buffer adhesion layer, the stress reduction layer and the buffer layer are deposited in a PECVD chamber.

17. The method of claim 16, wherein the buffer layer comprises fluorinated plasma-polymerized hexamethyldisiloxane (pp-HMDSO:F).

18. The method of claim 17, wherein the one or more precursor gases comprise one or more fluorine-containing gases and HMDSO gas.

19. The method of claim 18, wherein the fluorine-containing gas is selected from the group consisting of NF3, SiF4, F2, CF4, and combinations thereof.

20. The method of claim 19, wherein a ratio of flow rates of the fluorine-containing gas and HMDSO gas is between 0.25 and 1.5.

* * * * *